United States Patent [19]

Kreiter

[11] Patent Number: 4,581,320

[45] Date of Patent: Apr. 8, 1986

[54] HEATLESS AND PRESSURELESS FOIL TRANSFER METHOD

[75] Inventor: Herbert M. Kreiter, Skokie, Ill.

[73] Assignee: Castcraft Industries, Inc., Chicago, Ill.

[21] Appl. No.: 657,376

[22] Filed: Oct. 3, 1984

[51] Int. Cl.[4] .................. G03C 5/00; B44C 1/165
[52] U.S. Cl. .................. 430/320; 430/323; 430/325; 430/328; 430/331; 156/233; 156/240; 156/634
[58] Field of Search ............ 430/258, 308, 320, 323, 430/325, 328, 331; 101/127, 128.21, 128.4; 493/324, 325; 156/240, 233, 634

[56] References Cited

U.S. PATENT DOCUMENTS 4,215,194 7/1980 Shepherd .................. 430/323
4,242,378 12/1980 Arai .................. 427/264

Primary Examiner—John E. Kittle
Assistant Examiner—Joeé G. Dees
Attorney, Agent, or Firm—Laff, Whitesel, Conte & Saret

[57] ABSTRACT

A method of producing a decorative foil transfer design which eliminates the need for heat and pressure in the application of decorative foil to a surface. The method includes applying a foil assembly sheet to a substrate, applying lacquer and extender materials and a photo-sensitive emulsion over the foil assembly, exposing the photo-sensitive emulsion to a light through a design-bearing film, removing all material which does not underlie the hardened photo-sensitive emulsion, applying an adhesive, and transferring the foil design to the surface to be decorated.

10 Claims, No Drawings

HEATLESS AND PRESSURELESS FOIL TRANSFER METHOD

BACKGROUND

This invention relates to a method of producing a decorative foil transfer design that can be applied to any surface, and more particularly to a method and apparatus of producing a foil transfer design which does not require heat or pressure for application.

Presently, foil type designs are transferred onto the surface of items such as leather goods, glasses, decorative plates and other materials to be decorated by expensive machinery which require dies, heated platen presses and other large and bulky machinery, inasmuch as the foil design must be applied using heat and pressure. In a typical hot stamp foil application process, the foil is placed over a surface to which it is to be applied, a heated platen with a die or type element consisting of the design to be applied is pressed onto the foil, and the impact of the die or type element transfers the foil to the surface. The remainder of the foil outside the die is not applied on the surface, and is subsequently removed, leaving the foil design on the surface. An adhesive material is normally applied between the foil and the surface. The heat and the pressure applied through the above described machinery activates the adhesive to adhere the foil design to the surface.

It is apparent that presently available processes for the application of a foil design to a surface require expensive and bulky machinery which must be connected to sources of heat and pressure, such as a hot water system, electricity, and a pneumatic pump, for example. The use of such machinery requires large amounts of manufacturing space and a substantial amount of labor, thereby increasing the cost of applying foil designs to decorate an object.

SUMMARY OF THE INVENTION

The present invention constitutes an improved method of applying foil designs to surfaces of items such as plastics, glass and other suitable materials by eliminating the necessity for heat, large dies and expensive hot stamping machinery. Utilizing the presently disclosed system, a desired image is created on a sheet of foil by printing, photo projection, photographic contact, or the like, and the foil containing the image is placed on a transfer substrate whereupon it can be removed readily and adhered by adhesive to the surface to which it is ultimately to be applied. The preferred embodiment of the disclosed novel process relates to a transfer image of foil on a polyester sheet which originally formed the base of the foil. A major advantage of the presently disclosed system is that proofs or prototypes of foil design images can be easily prepared without going to the expense of using dies and large machinery. After a proof or prototype has been examined, changes in the ultimate design can readily be made in an inexpensive way.

DESCRIPTION OF THE PREFERRED EMBODIMENT

The process of the presently disclosed invention comprises initially preparing a multilayered assembly of materials which are ultimately to be exposed to actinic light under a negative comprising the illustration of the design to be applied to a substrate to be decorated. To initiate the process, a foil assembly sheet is applied to a base composed of Mylar or any other suitable substrate. In the preferred embodiment, the foil assembly comprises a first layer of polyester material, a second layer of foil material, such as dyed aluminum, a third layer of sizing material, and a fourth layer of adhesive. The foil assembly sheet comprising the above four sublayers and the substrate layer are then mechanically clamped together.

A clear lacquer is then applied over the adhesive overlying the foil assembly layer, and is dried preferably with an airblower or other suitable means. Next, a clear extender material is applied over the lacquer material, and then dried such as with a blowdryer or other suitable means. Next, an extender coat powder is applied over the extender layer. The extender coat powder contains a matting agent such as silicium dioxide. Finally, a photo-sensitive emulsion material is placed over the extender layer and powder. The total asembly is now ready to be exposed to actinic light under a negative comprising the design to be ultimately produced, as will be described hereinbelow.

The clear lacquer layer is directly applied to the foil assembly layer to add body to the design. The clear extender layer, which comprises a varnish compound, is also added to increase the body of the design to be ultimately produced. It has been discovered that the material of the extender layer does not adhere to the foil assembly layer, while the lacquer does. Therefore, the lacquer layer serves the dual purpose of also enabling the extender layer to adhere to the foil asembly layer. It has also been discovered that the application of two coats of lacquer, instead of a coat of lacquer and a coat of extender, would eventually attack the Mylar or other material used for the substrate. Therefore, it has been determined that the best manner of producing the inventive foil design is to use a lacquer coat with a clear extender coat on top thereof.

The extender coat powder layer applied over the clear extender is used to give the design a matte finish. This dulls the extender and makes the photo emulsion layer more acceptable to the extender coat to which it is applied. The extender coat powder also aids in avoiding pitting and mottling of the photo emulsion layer, and provides the emulsion layer with adhesion properties which allows the emulsion layer to better adhere to the extender layer.

After the above described assembly of layers of materials has been prepared, the entire assembly, photo emulsion side up, is then exposed through a negative to an actinic or ultraviolet light. The negative contains the design to be ultimately formed on the Mylar substrate layer. During the exposure process, light passing through the light parts of the negative exposes and polymerizes or hardens the portions of the photo emulsion layer exposed to the light. After exposing the assembly of materials, an ammonia based developer or solvent is used to remove unexposed photo emulsion. The ammonia based developer removes all unexposed photo emulsion, and also all of the extender coat powder lying beneath all unexposed photo emulsion.

The entire assembly is then dried, such as by airblowing, and then any unexposed extender remaining on the assembly is removed using an alcohol based extender developer or solvent. The assembly is again dried as by using an airblower, and the unexposed clear lacquer is next removed with an acetone based developer material. Following removal of the unexposed clear lacquer, the entire assembly is again dried, such as by an airblower.

The resulting product is next placed in a tray containing an acid based developer, which etches away all material in the foil assembly layer that is not covered by the exposed, hardened photo emulsion material. The acid based developer then removes any adhesive sizing and the aluminum layer in the foil which is not protected by the hardened photo emulsion. Agitation may be desirable to help the etching step until the aluminum coat is etched away, except that portion of the aluminum coat protected by the hardened photo emulsion. This removal phenomenon can be observed, because the shiny coat over the aluminum then disappears.

Next, the substrate and the remaining layers of material are washed with water. The water is then dried away such as by a blowdryer. A final cleanup is then performed to remove any residue haziness. This is accomplished preferably with a foam pad coated with a lacquer solvent, and provides a final cleanup around the design image to be developed. Finally, the lacquer solvent is dried such as with a blowdryer.

What remains is a layer of all materials applied as directed above under the hardened photo emulsion layer, clamped on the Mylar or other substrate used. All materials in the assembly above the substrate that were not protected by the hardened photo emulsion have been removed by the above described procedures. Next, an adhesive layer is applied above the hardened photo emulsion and over the image, with additional tacking material added to the adhesive so that when the foil material is rubbed off of the substrate, no residue is left around the image. The extra tacking material performs the purpose of shearing off the polyester sheet in the foil assembly layer from the substrate, and allows the image to shear off from the base sheet cleanly upon rubbing during the transfer step.

After the adhesive is applied, the entire assembly is dried such as with a blowdryer. What is produced is a foil image of a desired design, as dictated by the negative used previously, under an adhesive and hardened photo emulsion coat. The adhesive material will cause the image to be readily removed from the substrate sheet and adhere to any surface to which it is applied, such as glass, leather, plastic, wood or any other suitable surface. When removed from the substrate, the dyed aluminum layer remains on top, producing the desired ultimate foil image.

Because the transfer foil image thus produced is on a flexible substrate, the image can be applied to any irregularly or flat shaped surface merely by wrapping the substrate and image around the recipient surface, and rubbing off as in common transfer methods.

Thus, a foil transfer image which can be applied to any surface has been produced without the application of heat or pressure ordinarily used in presently available hot stamp foil systems. The transfer image as above described can be produced inexpensively without the use of time, labor, and energy consuming equipment.

Those who are skilled in the art will readily perceive how to modify the above described system. Therefore, the appended claims are to be construed to cover all equivalent structures which fall within the true scope and spirit of the invention.

We claim:

1. A method of producing a decorative foil transfer design on a substrate which is adapted be transferred to a surface to be decorated comprising the steps of:
    (a) applying a foil assembly sheet to said substrate, said foil assembly sheet including a layer of dyed foil material having a coat of adhesive overlying said foil layer;
    (b) applying a clear lacquer layer over the adhesive overlying said foil assembly layer;
    (c) drying said clear lacquer;
    (d) applying a clear extender material over said clear lacquer layer;
    (e) drying said clear extender material;
    (f) applying a coat of extender coat powder over said extender material;
    (g) applying a photo-sensitive emulsion material over said clear extender material and said extender coat powder;
    (h) exposing the foregoing layers of materials to actinic light through an image bearing film comprising the design to be formed on said decorative foil, whereby said photo-sensitive emulsion material hardens only where exposed to said actinic light;
    (i) removing unexposed photo-sensitive emulsion and extender coat powder only in the areas of said unexposed photo-sensitive emulsion by means of a developer;
    (j) drying the material remaining on said substrate;
    (k) removing said clear extender material only in the areas of said unexposed photo-sensitive emulsion by means of an extender developer;
    (l) drying the material remaining on said substrate;
    (m) removing said clear lacquer only in the areas of said unexposed photo-sensitive emulsion by means of a lacquer developer material;
    (n) drying the material remaining on said substrate;
    (o) etching away all material in said foil assembly sheet in the areas of said unexposed photo-sensitive emulsion by means of an acid based etching material;
    (p) washing said etching developer from said substrate and the material remaining on said substrate; and
    (q) drying the material remaining on said substrate.

2. The method of claim 1 including the additional steps of:
    (r) applying a layer of adhesive material over said material remaining on said substrate; and
    (s) applying said adhesive coated material to a surface to be decorated by separating said material from said substrate and adhering said material to said surface by said adhesive.

3. The method of claim 1 wherein said foil assembly sheet also includes a clear polyester sheet overlying said dyed foil material, and a layer of sizing between said dyed foil material and said adhesive.

4. The method of claim 1 wherein said dyed foil material is aluminum foil.

5. The method of claim 1 wherein said extender coat powder includes a matting agent.

6. The method of claim 5 wherein said matting agent is silicium dioxide.

7. The method of claim 1 wherein said developer for removing said unexposed photo-sensitive emulsion and said extender coat powder from said areas of said unexposed photo-sensitive emulsion is an ammonia-based solvent.

8. The method of claim 1 wherein said extender developer is an alcohol based solvent.

9. The method of claim 1 wherein said lacquer developer material is an acetone based solvent.

10. The method of claim 1 including the additional steps of removing any residue haziness from said material remaining on said substrate by applying a lacquer solvent to said material with a foam pad, and drying said lacquer solvent.

* * * * *